United States Patent
Weihnacht et al.

(10) Patent No.: US 11,300,545 B2
(45) Date of Patent: Apr. 12, 2022

(54) SYSTEM FOR THE NON-DESTRUCTIVE TESTING OF COMPONENTS

(71) Applicant: FRAUNHOFER-GESELLSCHAFT ZUR FOERDERUNG DER ANGEWANDTEN FORSCHUNG E.V., Munich (DE)

(72) Inventors: Bianca Weihnacht, Dresden (DE); Tobias Gaul, Dresden (DE); Uwe Lieske, Dresden (DE); Lars Schubert, Dresden (DE); Bernd Koehler, Dresden (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 84 days.

(21) Appl. No.: 15/930,536

(22) Filed: May 13, 2020

(65) Prior Publication Data
US 2020/0363374 A1 Nov. 19, 2020

(30) Foreign Application Priority Data
May 14, 2019 (DE) ..................... 10 2019 206 997.5

(51) Int. Cl.
*G01N 29/04* (2006.01)
*G01N 29/24* (2006.01)
*G01N 29/22* (2006.01)

(52) U.S. Cl.
CPC ......... *G01N 29/041* (2013.01); *G01N 29/223* (2013.01); *G01N 29/245* (2013.01);
(Continued)

(58) Field of Classification Search
CPC .. G01N 29/041; G01N 29/223; G01N 29/245; G01N 29/043; G01N 29/07;
(Continued)

(56) References Cited

U.S. PATENT DOCUMENTS

| | | | |
|---|---|---|---|
| 4,138,894 A | 2/1979 | Robert et al. | |
| 2004/0083813 A1* | 5/2004 | Arndt | B23K 11/12 73/579 |

(Continued)

FOREIGN PATENT DOCUMENTS

| | | |
|---|---|---|
| DE | 2556588 | 6/1976 |
| DE | 10104610 | 8/2002 |

OTHER PUBLICATIONS

German Office Action.

*Primary Examiner* — Suman K Nath
(74) *Attorney, Agent, or Firm* — Jacobson Holman PLLC

(57) ABSTRACT

In the system, two ultrasonic transducers, which form a pair and each have a piezoelectric ceramic plate-shaped element with a rectangular geometry, can be fastened to a surface of a component. The two ultrasonic transducers are arranged at a distance from one another such that there is no direct mechanical contact and they are arranged beside one another with a parallel orientation of their central longitudinal axes. The two elements have a different polarization along their width and are connected with the same polarity to an electrical voltage source. The two plate-shaped elements can also have an identical polarization along their width and can be connected in this case with opposite polarity to an electrical voltage source. At least one ultrasonic transducer and/or at least one further ultrasonic transducer is/are designed to detect ultrasonic waves reflected by defects and/or shear waves simultaneously emitted by the two ultrasonic transducers.

7 Claims, 3 Drawing Sheets

(52) U.S. Cl.
CPC ............ *G01N 2291/0289* (2013.01); *G01N 2291/044* (2013.01); *G01N 2291/048* (2013.01); *G01N 2291/102* (2013.01)

(58) Field of Classification Search
CPC .... G01N 29/2475; G01N 29/28; G01N 29/11; G01N 2291/0289; G01N 2291/044; G01N 2291/048; G01N 2291/102; G01N 2291/2675; G01N 2291/0422; B06B 2201/55; B06B 2201/74; B06B 1/0215; B06B 1/0648; H01L 41/0993
See application file for complete search history.

(56) References Cited

U.S. PATENT DOCUMENTS

| | | | |
|---|---|---|---|
| 2015/0303895 A1 | 10/2015 | Ballandras et al. | |
| 2017/0370962 A1* | 12/2017 | Cook | G01P 15/0915 |
| 2019/0033261 A1* | 1/2019 | Nielsen | G01D 4/002 |

* cited by examiner

SYSTEM FOR THE NON-DESTRUCTIVE TESTING OF COMPONENTS

BACKGROUND OF THE INVENTION

The invention relates to a system for the non-destructive testing of components. It can be advantageously used, in particular, for testing on large-format components or at locations which are difficult to access.

Welded seams have hitherto also been tested using sleeve solutions with shear waves. There has hitherto not been any finished technology for remaining on the component. In the offshore sector for testing foundation structures in particular, the divers cannot apply sleeves with a diameter of several metres during each test. Therefore, a sensor sleeve, into which special piezoelectric shear wave transducers are laminated, was developed. This can be effected in such a manner that a watertight system solution is obtained which can permanently remain on the respective test object (even underwater).

Offshore foundation structures are currently monitored by means of a visual inspection by divers. In this case, each installation must be inspected visually or with permitted non-destructive testing methods every four years. As a result of vegetation in particular, it is extremely difficult during the visual inspection to be able to reliably detect fine cracks. For non-destructive testing, only a visual inspection and the Alternating Current Focusing technique (ACFM) method have hitherto been permitted. In the case of ACFM, a magnetic crack test is carried out by divers. The method is very time-consuming since the coil sensor must be manually guided over all welded seams. The measured values obtained in this manner can be interpreted only by qualified personnel and cannot be interpreted by the divers. Sharp fillet seams are excluded from a test on account of their geometry. Root passes cannot be tested using the above-mentioned non-destructive testing methods on account of their position inside the pipe. Remote Operated Vehicles (ROV) have developed rapidly in recent years and are nowadays prior art for the inspection of underwater supporting structures, in particular in the oil and gas industry. The market is developing only slowly for offshore wind installations. ROVs are used for a conventional non-destructive test in order to inspect welded seams, for example. For this purpose, the location to be examined is cleaned (sandblasting, brushing and/or high-pressure cleaning) and is then inspected, for example visually, using ultrasonic measurement technology or ACFM. For the last two methods, the sensor head must be placed directly on the location to be examined, which is not possible in fillet seams, in particular. The large number of required measurement locations results in a long testing time.

There are likewise specific requirements imposed on the test for testing pipelines and containers. These requirements generally vary from sector to sector and are carried out as part of reviews. As a result of a continuous monitoring solution, expensive reviews (one example approximately €1 million per day in a coal-fired power plant) could be replaced with data capture and testing during operation.

For non-destructive testing measurements, a number of shear wave testing systems are available but currently cannot be used for permanent monitoring (the measurement system remains on the component). These are sensor sleeves with shear wave transducers, but were not designed to remain on the test object as a Structural Health Monitoring (SHM) solution (condition monitoring) and therefore are also not suitable for this purpose. It is possible to dispense with a recurring test as a result of the system remaining on the structure to be examined.

SUMMARY OF THE INVENTION

Therefore, the object of the invention is to specify possibilities for the non-destructive testing of components which can be used to test for defects under difficult conditions, with sufficient measurement accuracy and possibly also permanently.

According to the invention, this object is achieved with a system having the features of the claims.

In the system, two ultrasonic transducers, which form a pair and each have a piezoelectric ceramic plate-shaped element with a rectangular geometry, which are formed on two opposite surfaces each with an electrode, can be fastened to a surface of a component.

The ultrasonic transducers in the pair are arranged at a distance from one another such that there is no direct mechanical contact. According to the invention, the ultrasonic transducers in the pair can be arranged beside one another with a parallel orientation of their central longitudinal axes, wherein the central longitudinal axes should be oriented along a common axis.

In one alternative, the two piezoelectric ceramic plate-shaped elements have a different polarization along their width b. The two ultrasonic transducers in the pair are connected in this case with the same polarity to an electrical voltage source which can be operated in a pulsed manner.

In a second alternative, the two piezoelectric ceramic plate-shaped elements have an identical polarization along their width b. The two ultrasonic transducers in the pair are connected in this case with opposite polarity to an electrical voltage source which can be operated in a pulsed manner.

In this case, the width b should be understood as meaning the longer edge length of one side of the piezoelectric ceramic plate-shaped elements.

The electrical voltage source is designed to apply electrical voltages in the frequency range of 10 kHz to 1 MHz to the two ultrasonic transducers.

At least one of the two ultrasonic transducers in the pair or at least one further ultrasonic transducer arranged at a known distance from the two ultrasonic transducers is designed to detect ultrasonic waves reflected by defects on the component and/or shear waves simultaneously emitted by the two ultrasonic transducers in the pair, and to transmit the detected ultrasonic waves to an electronic evaluation and control unit. In this case, the electronic evaluation unit is designed to evaluate the detected ultrasonic waves with respect to their amplitude and/or their temporal sequence.

The invention can be used to provide novel shear wave transducers for testing structures using guided shear waves, which, in contrast to known solutions, provide the following possibilities. Inexpensive and also automatable production is therefore possible. There is a potential for long-term monitoring technologies.

Accordingly designed and arranged ultrasonic transducers can be used to achieve higher amplitudes of the emitted guided shear waves, which results in improved efficiency and an expansion of the possible range of uses.

The ultrasonic transducers in the pair can be very flat. The maximum thickness of the piezoelectric ceramic plate-shaped elements (dp) can be kept at ≤1 mm. The electrodes which can be used also increase the overall thickness only insignificantly. As a result of the low thickness of the ceramic material, an adaptation to the respective component surface can be achieved by means of elastic bending, with the result that the ultrasonic transducers in the pair can also rest in a flat manner in the case of uneven surfaces and, as a result, it becomes possible to couple the emitted shear waves into the component in a more efficient manner along its surface as guided shear waves.

The ratio of the width b to the length l of the piezoelectric ceramic plate-shaped elements b to l should be at least 3 to 1.

The centre or area centroid spacing of the piezoelectric ceramic plate-shaped elements of the ultrasonic transducers in the pair should be an odd integer multiple of half the wavelength λ of the emitted ultrasonic waves.

If the two ultrasonic transducers in a pair are activated, shear waves are emitted in the direction perpendicular to the central longitudinal axis of the ultrasonic transducers. The waves propagate in this direction in a divergent manner.

The ultrasonic transducers used in the invention are suitable, on account of the low component height, for being able to still carry out tests even at a distance of several metres, but nevertheless generate sufficiently high amplitudes. A fundamental advantage is the low installation space requirement and the flexibility. This makes it possible to apply networks with a large number of distributed ultrasonic transducers to the component surface without having to make structural changes to the latter. More than one pair of ultrasonic transducers for emitting the shear waves may also be part of the system.

The invention also makes it possible to retrofit existing components, which is of great advantage, for example, when used for unexpectedly occurring weak points or fault accumulations. The combination of a larger number of such sensors and actuators to form complex networks is likewise advantageous.

By means of the ultrasonic transducer pairs, their effect is superimposed during emission, with the result that the amplitudes of the emitted shear waves can be increased without complicated electronic individual connection of the individual transducers. In this case, the distance between the two ultrasonic transducers should be selected in such a manner that no direct transmission of force can take place between them.

The advantage of this invention is that non-destructive testing methods can now be used in a cost-effective manner as monitoring. This increases the safety of the examined components.

The ultrasonic transducers can be fixed to the component surface by means of an elastically deformable material.

For this purpose, the ultrasonic transducers can be embedded or laminated in an elastically deformable material. The ultrasonic transducers can be fastened to the respective component using elastically deformable material in the form of a sleeve which causes less characteristic impedance, for example in the offshore sector, when it is permanently fitted to the respective structure. They also find space under installations/coverings/enclosures for pipeline monitoring without the need to adapt the geometry.

The invention can be used, for example, in the offshore monitoring of underwater welded seams (crack detection), pipeline monitoring (crack detection, even under an insulation/covering/enclosure), in container monitoring for cracks and corrosion, even under an insulation/covering/enclosure.

When using the system, either pulse echo measurements can be carried out using at least one pair of ultrasonic transducers or transmission/reception measurements can be carried out between at least one pair of ultrasonic transducers and a further ultrasonic transducer which is arranged at a known distance from the respective pair. In order to determine damage, the wave components scattered at a defect can be detected in reflection or transmission and evaluated.

Burst signals which have a temporally limited length and a relatively narrow frequency spectrum are usually used to emit shear waves. The temporal length should be kept in the range of 5 μs to 1 ms. Detection can be carried out in the pauses in between in which no shear waves are emitted.

DESCRIPTION OF THE DRAWINGS

The invention shall be explained in more detail by way of example below. In this case, features can be combined with one another independently of the respective example or the respective illustration.

In the figures.

DETAILED DESCRIPTION OF THE INVENTION

Figure 1:
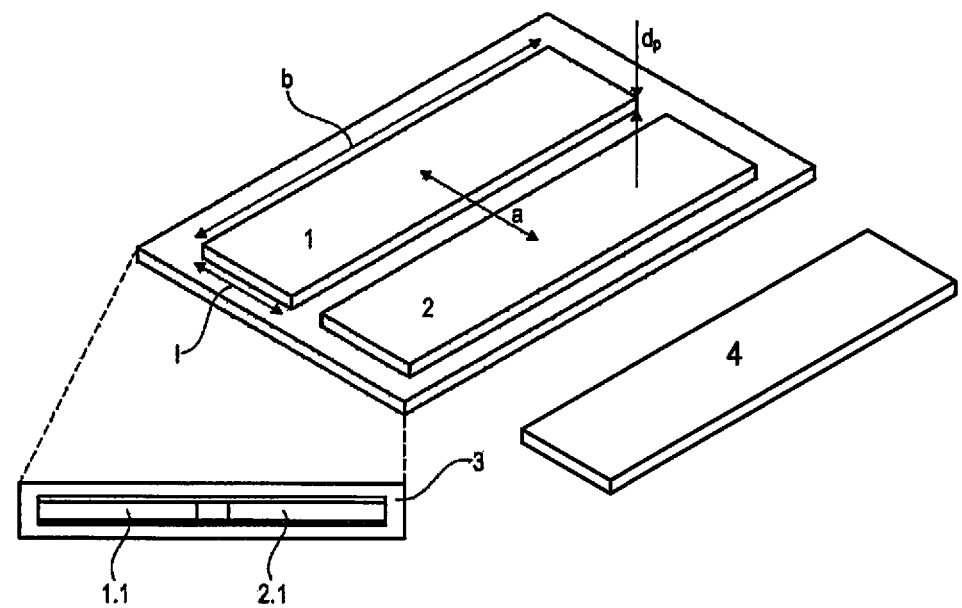
FIG. 1 shows two views of an example of a pair of ultrasonic transducers which can be used in the invention.

FIG. 1 shows a sectional illustration and a perspective illustration of an example of two ultrasonic transducers 1 and 2 which are arranged beside one another. In this case, their central longitudinal axes are oriented parallel to one another, in which case the two central longitudinal axes are also each oriented parallel to the edges with the length b. The two ultrasonic transducers 1 and 2 form a pair. At least one further ultrasonic transducer 4 is arranged at a known distance from the two ultrasonic transducers in the pair.

Figure 2:
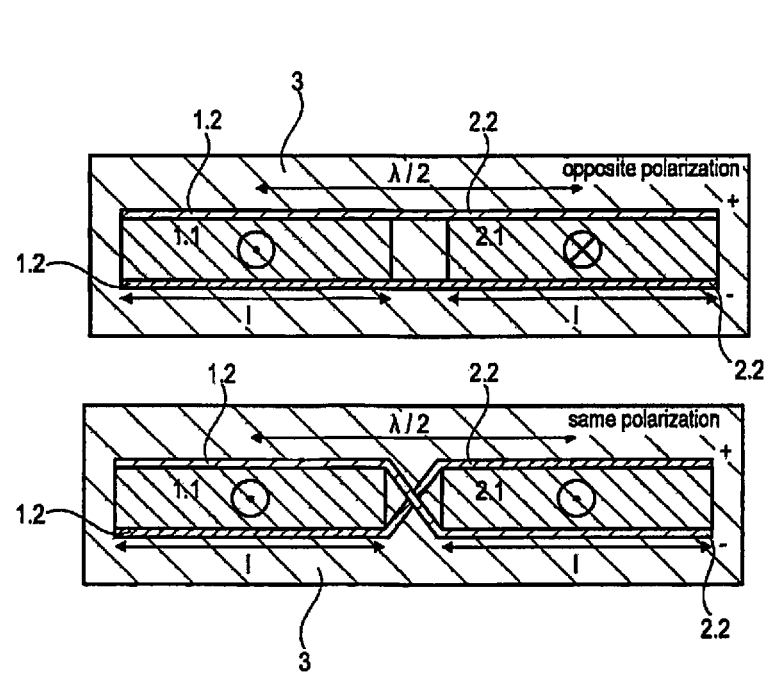
FIG. 2 shows two views of a further example of a pair of ultrasonic transducers which can be used in the invention.
Figure 3:
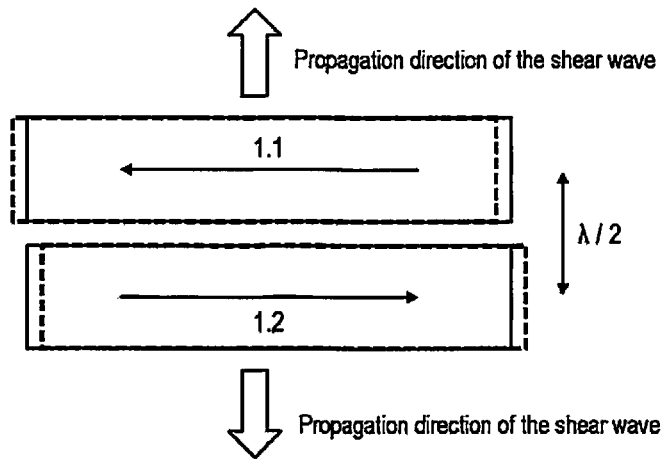
FIG. 3 shows the effective direction of emitted shear waves (plan view)

As can be gathered from FIG. 2, in particular, an electrode 1.2 and 2.2 is respectively present on the two opposite surfaces of the piezoelectric ceramic elements 1.1 and 2.1, which electrodes are connected to an electrical voltage source (not shown). The electrical voltage source can be operated in a pulsed manner directly or via a frequency generator and can be controlled by an electronic evaluation and control unit (likewise not shown). The electrical power and the frequency with which shear waves are emitted can therefore be influenced in a defined manner.

The spacing a of the area centroids of the two piezoelectric ceramic plate-shaped elements 1.1 and 2.1 is selected in the manner mentioned in the general part of the description. The spacing a is selected such that there is no direct touching mechanical contact, with the result that said elements do not directly mechanically influence one another during their operation.

The actual detection of defects can be carried out as described in the general part of the description or as known, in principle, from the prior art.

The two ultrasonic transducers 1 and 2 which form a pair can be laminated in an elastically deformable material 3.

Figure 4:
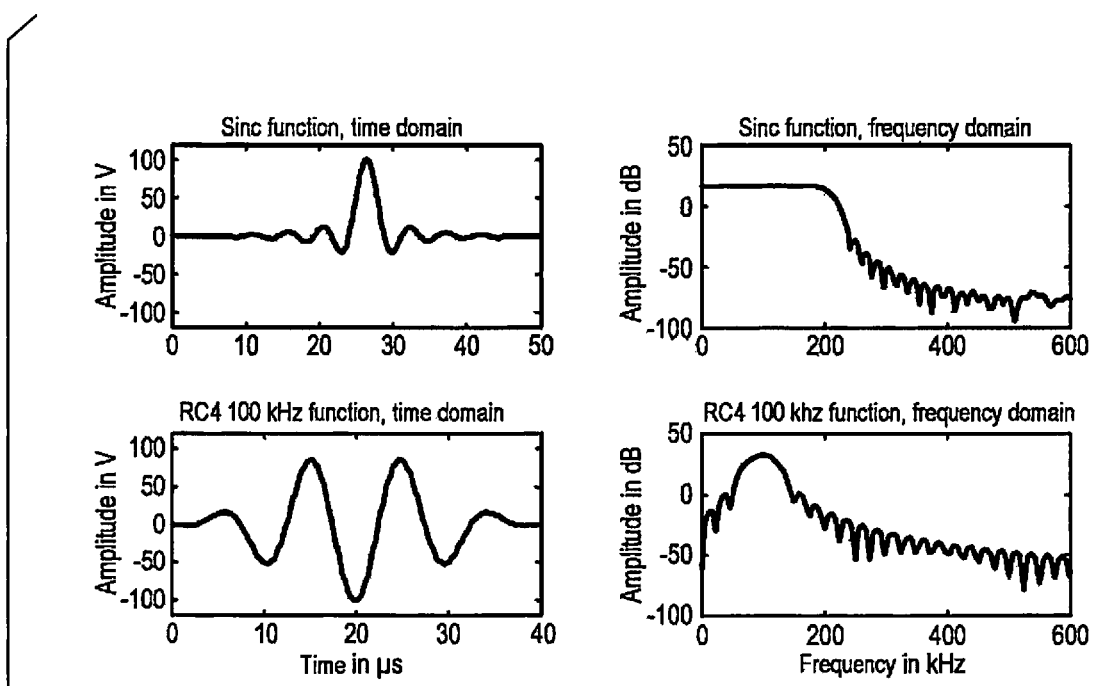
FIG. 4 shows an example of transmission functions which can be carried out as a broadband transmission signal (Sinc, at the top) or as a bandwidth-limited transmission signal (RC4)

The amplitudes which can be captured can be gathered in a time-resolved manner or on the basis of the respective frequency from the graphs shown in FIG. 4 for emitted shear waves which are referred to as a broadband transmission signal (Sinc function, windowed) or as a bandwidth-limited transmission signal (RC4). These are a broadband transmission signal of up to 200 kHz (Sinc) and a bandwidth-limited transmission signal (RC4 at 100 kHz).

The speed of shear waves is defined as follows:

$$c(\omega) = \frac{c_s}{\sqrt{1 - (\eta d)^2 \left(\frac{c_s}{\omega d}\right)^2}}$$

$$c_s = \sqrt{\frac{G}{\rho}}$$

with G . . . shear modulus, $\rho$ . . . density $$\omega = 2\pi f$$

$$\eta d = k\frac{\pi}{2}, k = 0, 1, 2, 3, \ldots$$

d . . . half the structure thickness
f . . . frequency

In this case, k describes the order of the wave mode (SH0, SH1, SH2, . . . ). For the fundamental shear wave mode (k=0), the formula is reduced to the pure transverse wave speed. The wavelength can be calculated from the known propagation speed cs and the frequency f of the transmission signal.

$$\lambda = \frac{c_s}{f}$$

Laboratory measurements showed that the efficiency of the two ultrasonic transducers 1 and 2 can be increased in comparison with a simple arrangement by virtue of the two opposite piezoelectric ceramic plate-shaped elements 1.1 and 2.1, that is to say the proportion of energy of the shear waves emitted in the intended propagation direction increases for the same volume of piezoelectric ceramic material.

Figure 5:
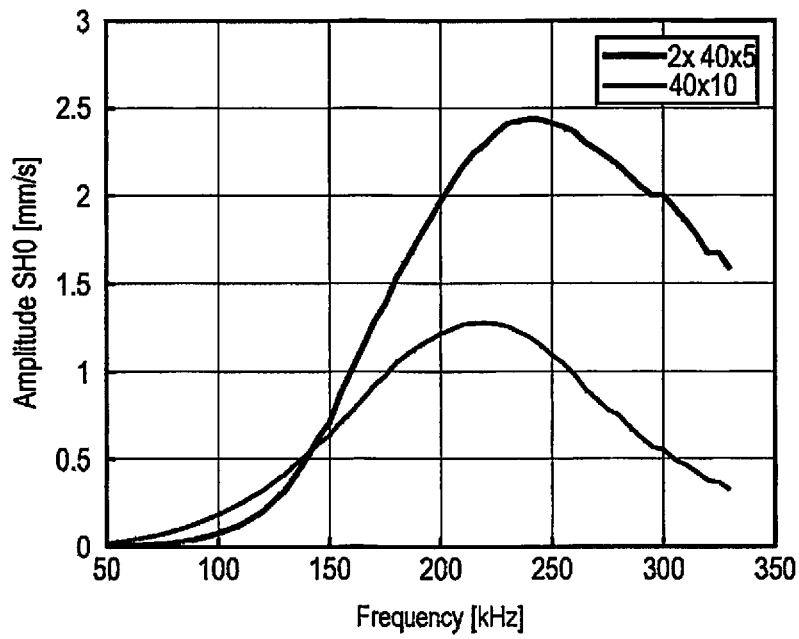
FIG. 5 shows a graph of the frequency-dependent achievable vibration speed of the SH0 mode in the comparison; excitation by means of a simple ultrasonic transducer 40 mm×10 mm (black curve) vs. two ultrasonic transducers 40 mm×5 mm (×2) forming a pair (grey curve), as can be used in the invention (recorded by means of laser vibrometry at a distance of 200 mm from the centre of the ultrasonic transducers)
Figure 6:
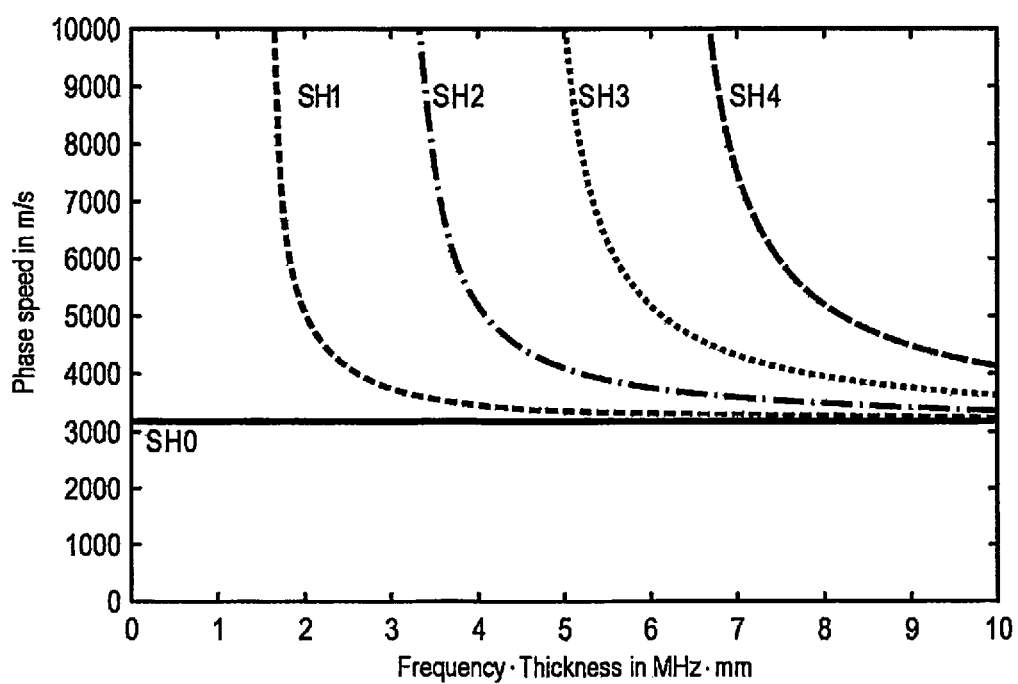
FIG. 6 shows a typical phase speed graph of the shear wave modes for the material steel.

The frequency-dependent achievable amplitudes in the comparison of simple ultrasonic transducers 40 mm×10 mm (black curve profile) in comparison with the two ultrasonic transducers 40 mm×5 mm (×2) forming a pair, as can be used in the invention (grey curve profile), can be gathered from the graph shown in FIG. 5.

The invention claimed is:

1. A system for the non-destructive testing of components, comprising two ultrasonic transducers, which form a pair and each have a piezoelectric ceramic plate-shaped element with a rectangular geometry with a width, length, and thickness, which are formed on two opposite surfaces each with an electrode, fastened to a surface of a component, wherein the two ultrasonic transducers in the pair are arranged at a distance from one another such that there is no direct mechanical contact and the two ultrasonic transducers in the pair are arranged beside one another with a parallel orientation of their central longitudinal axes, and the two piezoelectric ceramic plate-shaped elements have a different polarization along their width, and the two ultrasonic transducers in the pair are connected in this case with the same polarity to an electrical voltage source which can be operated in a pulsed manner, or the two piezoelectric ceramic plate-shaped elements have an identical polarization along their width, and the two ultrasonic transducers in the pair are connected in this case with opposite polarity to an electrical voltage source which can be operated in a pulsed manner, and the electrical voltage source is designed to apply electrical voltages in a frequency range of 10 kHz to 1 MHz to the two ultrasonic transducers, and at least one of the two ultrasonic transducers in the pair and at least one further ultrasonic transducer arranged at a known distance from the two ultrasonic transducers in the pair are designed to detect ultrasonic waves reflected by defects on the component and/or shear waves simultaneously emitted by the two ultrasonic transducers in the pair, whereby a pulse echo measurement is carried our using the at least one pair of ultrasonic transducers or a transmission/reception measurement is carried out between the at least one pair of ultrasonic transducers and the at least one further ultrasonic transducer which is arranged at a known distance from the respective pair and the detected ultrasonic waves are transmitted to an electronic evaluation and control unit, wherein the electronic evaluation unit is designed to evaluate the detected ultrasonic waves with respect to their amplitude and/or their temporal sequence.

2. The system according to claim 1, wherein the centre or area centroid spacing of the piezoelectric ceramic plate-shaped elements of the ultrasonic transducers in the pair is an odd integer multiple of half the wavelength of the emitted ultrasonic waves.

3. The system according to claim 1, wherein the ratio of the width to the length of the piezoelectric ceramic plate-shaped elements at least 3 to 1.

4. The system according to claim 1, wherein the piezoelectric ceramic plate-shaped elements have a maximum thickness of 1 mm.

5. The system according to claim 1, wherein the ultrasonic transducers in the pair can be fastened to the respective component by means of an elastically deformable material.

6. The system according to claim 1, wherein the at least two ultrasonic transducers in the pair are embedded or laminated in an elastically deformable material.

7. The system according to claim 1, wherein a sleeve is formed with elastically deformable material which fastens the ultrasonic transducers in the pair to the surface of the respective component such that the ultrasonic transducers rest on the respective component surface in a flat manner.

* * * * *